United States Patent
Wu et al.

(10) Patent No.: US 11,535,925 B2
(45) Date of Patent: Dec. 27, 2022

(54) TENSIONING DEVICE, BASE, CLAMP AND METHOD FOR CLAMPING MASK PLATE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Jianpeng Wu, Beijing (CN); Zhongying Yang, Beijing (CN); Chang Luo, Beijing (CN)

(73) Assignees: BEIJING BOE TECHNOLOGY DEVELOPMENT CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 776 days.

(21) Appl. No.: 16/303,469

(22) PCT Filed: Apr. 19, 2018

(86) PCT No.: PCT/CN2018/083730
§ 371 (c)(1),
(2) Date: Nov. 20, 2018

(87) PCT Pub. No.: WO2018/223782
PCT Pub. Date: Dec. 13, 2018

(65) Prior Publication Data
US 2021/0222280 A1    Jul. 22, 2021

(30) Foreign Application Priority Data
Jun. 9, 2017   (CN) .......................... 201710433816.7

(51) Int. Cl.
*C23C 14/12*   (2006.01)
*C23C 14/04*   (2006.01)
(Continued)

(52) U.S. Cl.
CPC ............ *C23C 14/042* (2013.01); *C23C 14/12* (2013.01); *C23C 14/24* (2013.01); *C23C 14/50* (2013.01);
(Continued)

(58) Field of Classification Search
CPC ........... H01L 21/67346; H01L 51/0017; H01L 21/687; C23C 14/24; C23C 14/50; C23C 14/042; C23C 14/12
See application file for complete search history.

(56) References Cited

U.S. PATENT DOCUMENTS

| | | | | |
|---|---|---|---|---|
| 5,820,104 A | * | 10/1998 | Koyano | ............ H01L 21/67126 251/326 |
| 2011/0061468 A1 | * | 3/2011 | Park | .......................... G03F 1/20 73/831 |

(Continued)

FOREIGN PATENT DOCUMENTS

| | | |
|---|---|---|
| CN | 103116428 A | 5/2013 |
| CN | 104928621 A | 9/2015 |

(Continued)

OTHER PUBLICATIONS

The International Search Report and Written Opinion dated Jun. 27, 2018; PCT/CN2018/083730.
(Continued)

*Primary Examiner* — Yuechuan Yu

(57) ABSTRACT

A tensioning device, including a base configured to carry a mask plate, a clamp configured to clamp the mask plate, and a deformation adjusting assembly provided on the base or on the clamp, wherein the deformation adjusting assembly is (Continued)

configured to adjust a deformation of an end portion of the mask plate protruding from the base in a direction of gravity when the base carries the mask plate, so as to make the deformation less than a preset deformation threshold. A base, a clamp and a clamping for the mask plate are also provided.

14 Claims, 7 Drawing Sheets

(51) Int. Cl.
    *C23C 14/24*     (2006.01)
    *C23C 14/50*     (2006.01)
    *H01L 51/00*     (2006.01)
    *H01L 21/687*     (2006.01)
    *H01L 21/673*     (2006.01)

(52) U.S. Cl.
    CPC ...... *H01L 21/67346* (2013.01); *H01L 21/687* (2013.01); *H01L 51/0017* (2013.01)

(56) References Cited

U.S. PATENT DOCUMENTS

2013/0318774 A1* 12/2013 Kang .................... B05C 21/005
    29/592
2015/0155193 A1* 6/2015 Hsu .................. H01J 37/32715
    156/345.24
2017/0369982 A1 12/2017 Ma et al.

FOREIGN PATENT DOCUMENTS

| CN | 205662588 U | | 10/2016 |
| CN | 206126317 U | * | 4/2017 |
| CN | 206126317 U | | 4/2017 |
| CN | 107142450 A | | 9/2017 |
| CN | 107245694 A | | 10/2017 |
| JP | 2004-303305 A | | 10/2004 |

OTHER PUBLICATIONS

The First Chinese Office Action dated Dec. 4, 2018; Appln. No. 201710433816.7.

* cited by examiner

```
adjusting a deformation of an end portion of a mask plate
protruding from a base in a direction of gravity when the
base carries the mask plate, so as to make the
deformation less than a preset threshold
                        ↓
        grasping the mask plate through the clamp
```

TENSIONING DEVICE, BASE, CLAMP AND METHOD FOR CLAMPING MASK PLATE

The present disclosure claims priority of Chinese Patent Application No. 201710433816.7 filed on Jun. 9, 2017, the disclosure of which is hereby entirely incorporated by reference as a part of the present disclosure.

TECHNICAL FIELD

Embodiments of the present disclosure relate to a tensioning device, a base, a clamp and a method for clamping a mask plate.

BACKGROUND

An evaporation process is an important process in the processes for manufacturing an organic light-emitting layer of an Organic Light-Emitting Diode (OLED) display, and desired patterns are formed on a substrate to be vapor-deposited by vacuum evaporation using a mask plate assembly with a pattern, wherein the mask plate assembly comprises a metal frame and a mask plate which is fixed to the metal frame. When fixing the mask plate to the metal frame, it is required to use a tensioning device to tension the mask plate on the metal frame and then fix it. The mask plate can be a fine metal mask (FMM for short).

SUMMARY

At least one embodiments of the present disclosure provides a tensioning device, comprising: a base, configured to carry a mask plate; a clamp, configured to clamp the mask plate; and a deformation adjusting assembly, provided on the base or on the clamp; wherein the deformation adjusting assembly is configured to adjust a deformation of an end portion of the mask plate protruding from the base in a direction of gravity when the base carries the mask plate, so as to make the deformation less than a preset deformation threshold.

In one embodiment of the present disclosure, the deformation adjusting assembly comprises an electromagnet and a current control unit; and the electromagnet is connected to the current control unit, and the current control unit is configured control a magnitude of an output current so as to control an electromagnetic force of the electromagnet.

In one embodiment of the present disclosure, the tensioning device further comprises a measuring unit, configured to measure an initial deformation of the end portion of the mask plate protruding from the base in the direction of gravity, the initial deformation is a deformation of the end portion of the mask plate protruding from the base in the direction of gravity before being adjusted by the deformation adjusting assembly, and the current control unit is configured to be connected to the measuring unit and to acquire the initial deformation from the measuring unit and determine an output current according to the initial deformation, and output the output current to the electromagnet.

In one embodiment of the present disclosure, magnitude of the output current of the current control unit is equal to a product of the initial deformation and a preset ratio, and the electromagnetic force of the electromagnet is required to be less than or equal to a gravity applied to the end portion of the mask plate protruding from the base.

In one embodiment of the present disclosure, the deformation adjusting assembly comprises n1 detachable magnets, n1 being an integer greater than or equal to 2.

In one embodiment of the present disclosure, the tensioning device further comprises a supporting rod, wherein the supporting rod has a first end disposed on the base and the deformation adjusting assembly is provided at a second end of the supporting rod and is located above a working surface of the base.

In one embodiment of the present disclosure, the clamp comprises a clamping component, and the clamping component comprises a first sub-clamping member and a second sub-clamping member; wherein the first sub-clamping member and the second sub-clamping member being movably connected, one end of the first sub-clamping member is located above the plane of the working surface of the base, and one end of the second sub-clamping member is located below the plane of the working surface of the base; and the deformation adjusting assembly is provided on the first end of the one end of the first sub-clamping member.

In one embodiment of the present disclosure, the tensioning device comprises n2 clips, n2 supporting rods, and n2 deformation adjusting assemblies, wherein n2 is an integer greater than or equal to 4, and the n2 supporting rods are arranged in one-to-one correspondence with the n2 deformation adjusting assemblies.

At least one embodiment of the present disclosure provides a base, comprising a base body, a supporting rod, and a deformation adjusting assembly; wherein one end of the supporting rod is connected to the base body, another end of the supporting rod is provided with the deformation adjusting assembly, and the deformation adjusting assembly is located above the work surface of the base body.

In one embodiment of the present disclosure, the deformation adjusting assembly comprises an electromagnet and a current control unit, the electromagnet is connected to the current control unit, and the current control unit controls an electromagnetic force of the electromagnet by controlling an output current.

At least one embodiment of the present disclosure provides a clamp, comprising a clamp body and a deformation adjusting assembly, wherein the clamp body comprises a clamp assembly, the clamp assembly comprises a first sub-clamp and a second sub-clamp which are movably connected to each other, and the deformation adjusting assembly is provided at one end of the first sub-clamp.

In one embodiment of the present disclosure, the deformation adjusting assembly comprises an electromagnet and a current control unit, the electromagnet is connected to the current control unit, and the current control unit controls an electromagnetic force of the electromagnet by controlling an output current.

At least one embodiment of the present disclosure provides a clamping method for a mask plate, applicable to the tensioning device as described above, the method comprising adjusting a deformation of an end portion of a mask plate protruding from a base in a direction of gravity when the base carries the mask plate, through the deformation adjusting assembly, so as to make the deformation less than a preset threshold; and grasping the mask plate through the clamp.

In one embodiment of the present disclosure, adjusting the deformation of the end portion of the mask plate protruding from the base in the direction of gravity through the deformation adjusting assembly comprises: adjusting the deformation of the end portion of the mask plate protruding from the base in the direction of the gravity through an electromagnet.

In one embodiment of the present disclosure, before adjusting the deformation of the end portion of the mask plate protruding from the base in the direction of the gravity through the electromagnet, the method further comprises: measuring an initial deformation of an end portion of the mask plate protruding from a base in the direction of gravity, the initial deformation being a deformation of the end portion of the mask plate protruding from the base without being adjusted by the deformation adjusting assembly; and determining a current to be output by the current control unit according to the initial deformation, and outputting the current to the electromagnet.

In the embodiments of the present disclosure, the deformation adjusting assembly is provided on the base or the clamp, and when the base carries the mask plate, a deformation amount of the mask plate protruding from an edge of the base is adjusted by the deformation adjusting assembly such that the deformation amount of the mask plate is less than a present deformation threshold, thereby facilitating the clamp to clamp the mask plate smoothly.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 2-1 is a schematic structural view of a tensioning device according to an embodiment of the present disclosure;

FIG. 2-2 is a schematic structural view of a tensioning device according to another embodiment of the present disclosure;

FIG. 3-1 is a schematic structural view of a tensioning device according to still another embodiment of the present disclosure;

FIG. 3-1*a* is a schematic structural view of a tensioning device according to yet another embodiment of the present disclosure;

FIG. 3-1*b* is a schematic structural view of a tensioning device according to still another embodiment of the present disclosure;

FIG. 3-1*c* is an effect diagram of adjusting the amount of deformation of an end of the mask plate protruding from a base in the direction of gravity according to an embodiment of the present disclosure;

FIG. 3-1*d* is a plan view of a mask plate according to an embodiment of the present disclosure;

FIG. 3-2 is a schematic structural view of a tensioning device according to yet another embodiment of the present disclosure;

FIG. 3-2*a* is an effect diagram of adjusting the amount of deformation of an end of the mask plate protruding from an end of a base in a direction of gravity according to another embodiment of the present disclosure;

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In a tensioning device of a related art, when the mask plate is carried on the base, since an end of the mask plate protrudes from the base, the protruding end is deformed in the direction of gravity due to gravity. When the amount of the deformation exceeds a certain amount, the mask plate cannot be gripped smoothly by a clamper.

Figure 1:
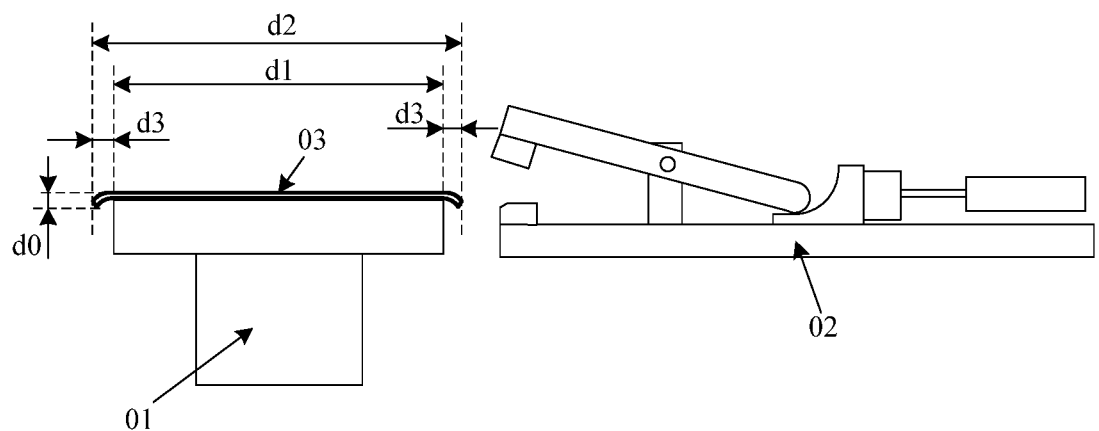
FIG. 1 is a schematic structural view of a tensioning device of a relevant art.

Please refer to FIG. 1. FIG. is a schematic structural view of the tensioning device of the relevant art as described. The tensioning device comprises a base 01 and a clamp 02, and the base 01 is configured to carry the mask plate 03 such that the base plate 03 can be conveniently clamped by the clamp 02. The width d2 of the mask sheet 03 is required to be greater than the width d1 of the base 01, and usually by 30 mm. That is, when the base 01 carries the mask sheet 03, the end portion of the mask sheet 03 protrudes from both sides of the base 01 by a distance d3 of 15 mm.

However, the end portions of the mask protruding from both sides of the base are deformed in the direction of gravity under the effect of their own gravity. For example, as illustrated in FIG. 1, the end portions of the mask 03 protruding from the edge of the base 01 have deformations of d0 in the direction of gravity. When d0 is larger than 1 mm, the clamp cannot grasp the mask smoothly.

Figures 1, 2:
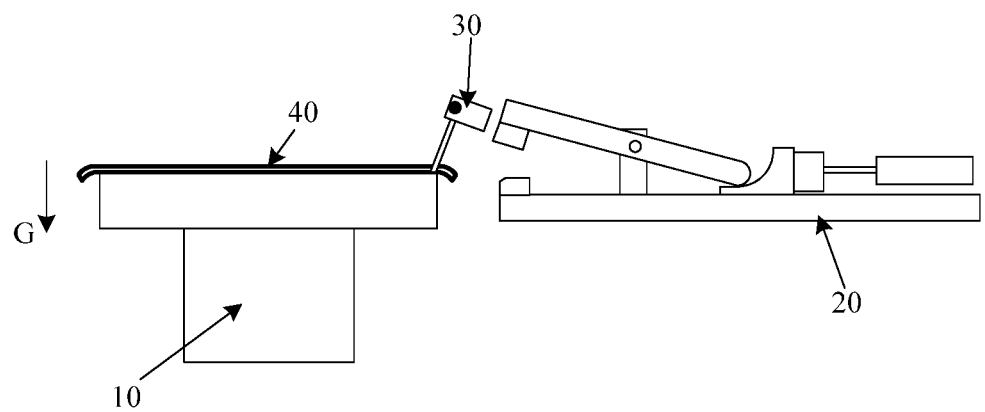
Figure 2:
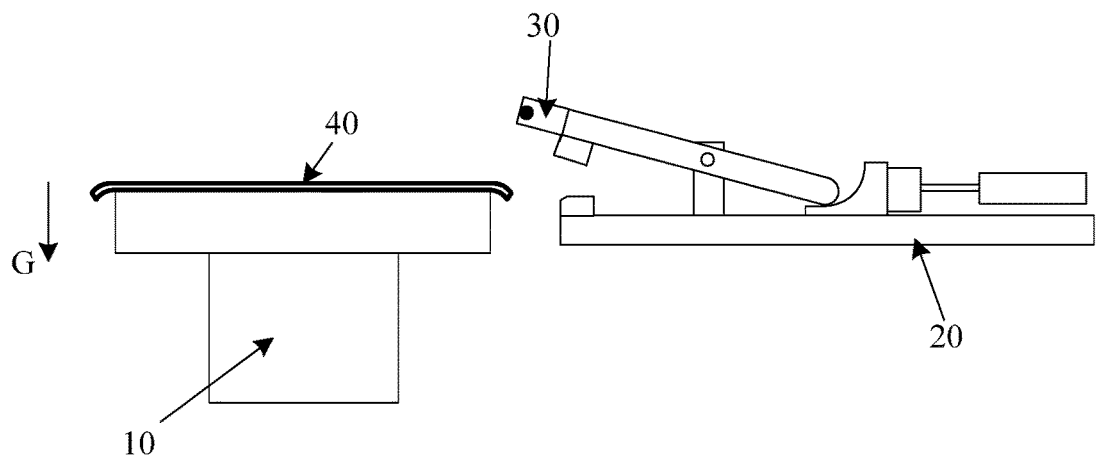

At least one embodiment of the present disclosure provides a tensioning device, as illustrated in FIGS. 2-1 and 2-2, wherein FIG. 2-1 is a schematic structural view of a tensioning device according to an embodiment of the present disclosure, and FIG. 2-2 is a schematic structural view of a tensioning device according to another embodiment of the present disclosure. The tensioning device comprises:

a base 10 configured to carry a mask plate; a clamp 20 configured to grasp the mask plate; and a deformation adjusting assembly 30 provided on the base 10 or the clamp 20.

As illustrated in FIG. 2-1, the deformation adjusting assembly 30 is provided on the base 10, and as illustrated in FIG. 2-2, the deformation adjusting assembly 30 is provided on the clamp 20.

The deformation adjusting assembly 30 is configured to adjust a deformation amount of the mask plate 40 protruding from an edge of the base 10 in the direction of gravity G when the base 10 carries the mask plate 40 such that the deformation amount is less than a preset deformation threshold.

In summary, in the tensioning device according to the embodiment of the present disclosure, the deformation adjusting assembly is provided on the base or the clamp, and when the base carries the mask plate, a deformation amount of the mask plate protruding from an edge of the base is adjusted by the deformation adjusting assembly such that the deformation amount of the mask plate is less than a present deformation threshold, thereby facilitating the clamp to clamp the mask plate smoothly.

Figures 1, 3:
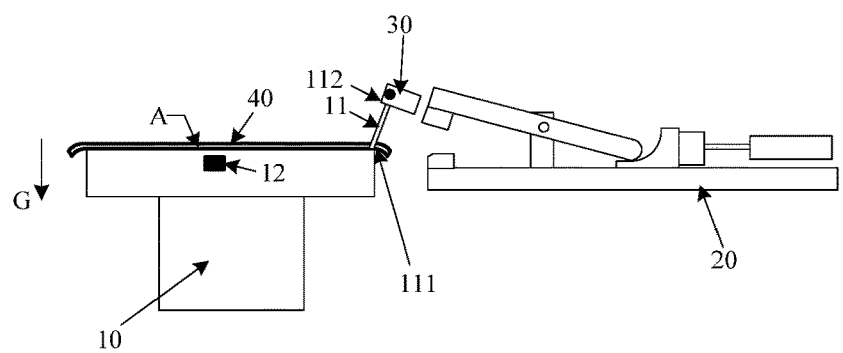

Please refer to FIG. 3-1, which is a schematic structural view of a tensioning device according to another embodiment of the present disclosure, wherein the deformation adjusting assembly is provided over a base of the tensioning device. The tensioning device further comprises a supporting rod 11 having a first end 111 disposed on the base 10 and the deformation adjusting assembly is provided at a second end 112 and is located above a working surface of the base 10, the working surface being the plane on which the base 10 carries the mask. It should be noted that the supporting rod can be a bent structure, and the first end of the supporting rod is disposed outside the area of the base, thereby avoiding reduction in the area of the working surface of the base due to the provision of the supporting rod; the deformation adjusting assembly provided at the second end of the supporting rod is located outside the working surface of the base, thereby preventing other areas of the mask from being affected due to its own magnetic force.

Referring to FIG. 3-1, the tensioning device can further comprise: a measuring unit 12, which can be a laser sensor. The measuring unit 12 can be disposed on the base 10, and the measuring unit 12 is configured to measure an initial deformation of the end portion the mask plate 40 which protrudes from the edge of the base 10 in the direction of gravity G, which is a deformation of the mask plate 40 that protrudes from the edge of the base 10 in the direction of gravity before being adjusted by the adjusting assembly 30. It should be noted that the measuring unit can be moved on the base. When moving to the edge of the base, the deformation of the mask plate protruding from the edge of the base in the direction of gravity can be measured.

Figures 1A, 3:
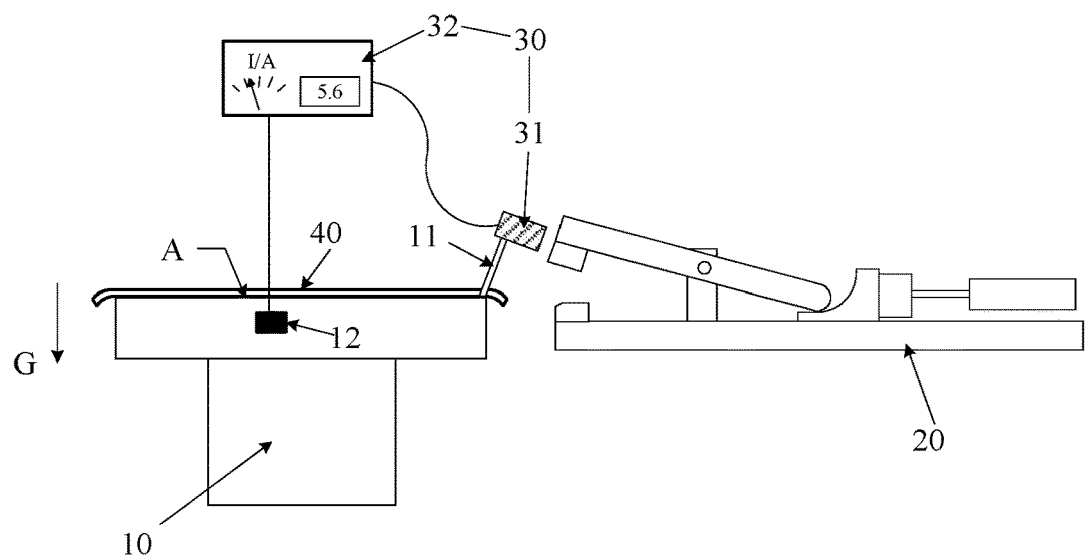

Referring to FIG. 3-1a, which is a schematic structural diagram of a tensioning device according to another embodiment of the present disclosure. The deformation adjusting assembly 30 can comprise an electromagnet 31 and a current control unit 32, and the electromagnet 31 can be provided at the second end of the supporting rod 11. The current control unit 32 is connected to an electromagnet 31, and controls an electromagnetic force of the electromagnet 31 by controlling magnitude of an output current output. Further, when the base 10 carries the mask plate 40, due to different positions of the mask plate 40, deformations of the end portion of the mask plate 40 protruding from the edge of the base 10 are different in the direction of gravity G. The output current of the current control unit 32 can be changed so as to change the electromagnetic force of the electromagnet 31, and thus adjusting the different deformations generated in the gravity direction G so as to make the different deformations smaller than the preset deformation threshold.

In one embodiment of the present disclosure, as illustrated in FIG. 3-1a, the current control unit 32 is coupled to the measuring device 12 to obtain an initial deformation of the mask plate 40 protruding from the edge of the base in the direction of gravity G from the measuring device 12, and the current control unit 32 is configured to determine an current according to the initial deformation and output the current to the electromagnet 31. For example, the initial deformation of the mask plate 40 protruding from the edge of the base 10 in the gravity direction G can be measured by the measuring unit 12, so that an electromagnetic force required by the electromagnet 30 to adjust the initial deformation so as to make the initial deformation less than the predetermined deformation threshold, and further, the output current of the current control unit 32 can be determined.

Optionally, magnitude of the output current of the current control unit is equal to the product of the initial deformation and a preset ratio, wherein the preset ratio is greater than 0. That is, the output current of the current control unit is proportional to the size of the initial deformation. The electromagnetic force of the electromagnet is required to be less than or equal to the gravity applied to the end portion of the mask plate protruding from the base, thereby preventing the protruding end portion from being bent upward due to excessive electromagnetic force.

Figures 1B, 3:
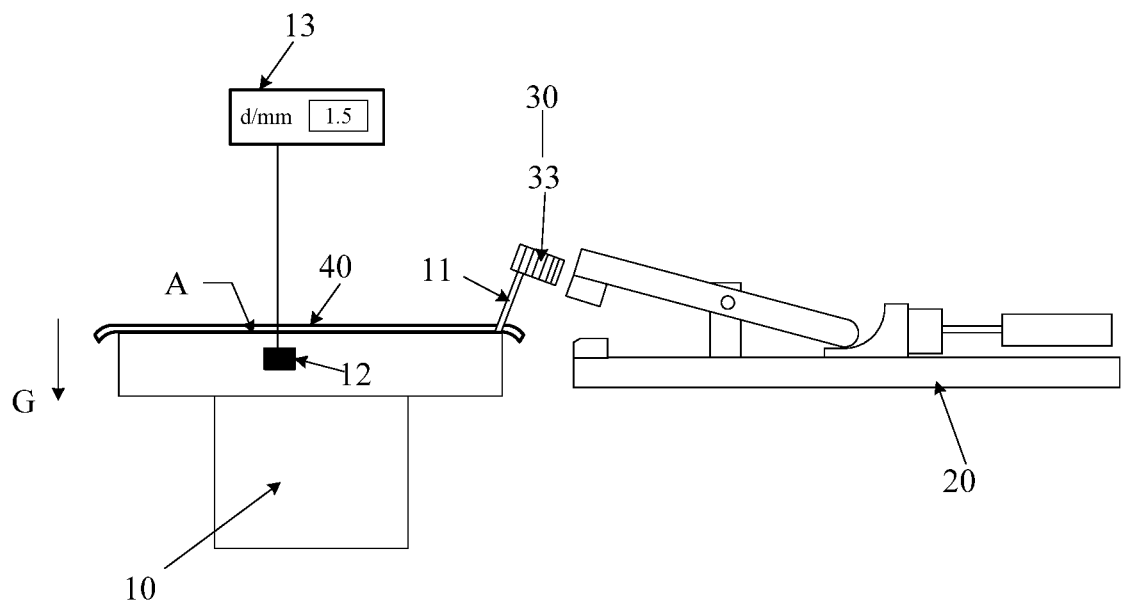

Please refer to FIG. 3-1b, which is a schematic structural diagram of a tensioning device according to another embodiment of the present disclosure. The deformation adjusting assembly 30 can comprise: n1 detachable magnets 33, where n1 is an integer greater than or equal to 2, the n detachable magnets 33 can be provided at the second end of the supporting rod 11. When the base 10 carries the mask plate 40, the deformations of the mask plate 40 protruding from the base 10 in the direction of gravity G are different due to the difference in the positions of the mask plate 40. The number of the magnets 33 can be changed according to the deformation of the mask plate 40 in the direction of gravity G so as to change the magnetic force of the deformation adjusting assembly 30, such that the deformation of the mask plate 40 can be adjusted to be less than the preset deformation threshold.

As illustrated in FIG. 3-1b, the tensioning device can further comprise: a display unit 13 configured to acquire the initial deformation from the measuring unit 12 and display it. Based on the initial deformation, an operator can determine an magnetic force required by the deformation adjusting assembly 30 to adjust the deformation of the mask plate so as to make the deformation less than the preset deformation threshold. And further, the operator can determine the number of the magnets 33 in the deformation adjusting assembly 30.

In one embodiment of the present disclosure, the magnetic force of the adjustment assembly is required to be less than or equal to the gravity applied to the end portion of the mask plate protruding from the base, thereby preventing the end portion protruding from the base from being bent upward due to excessive magnetic force.

Figures 1C, 3:
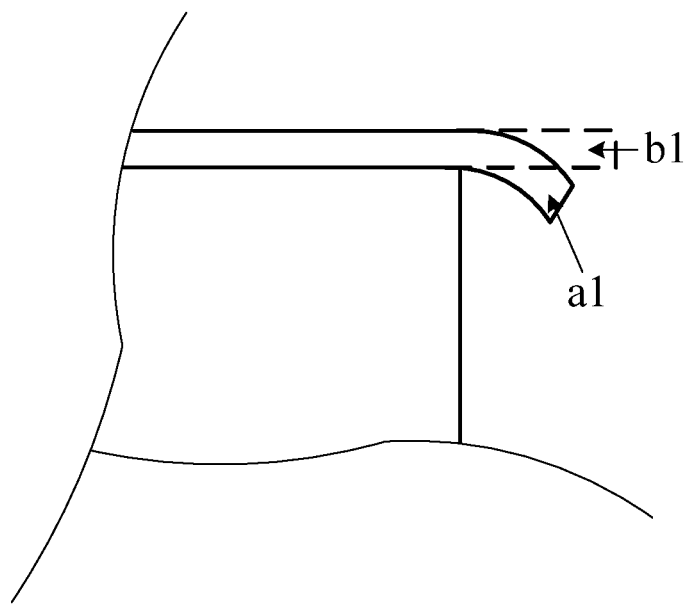

Referring to FIG. 3-1, since the deformation adjusting assembly 30 is provided at the second end of the supporting rod 11, the distance between the deformation adjusting assembly 30 and the end portion of the mask plate 40 protruding from the base 10 is fixed, and the magnetic force applied on the end portion of the mask plate protruding from the base by the deformation adjusting assembly 30 will not be affected by change in the distance. And then, the magnetic force applied by the deformation adjusting assembly 30 can adjust directly the deformation of the mask plate 40 protruding from the base in the direction of gravity G, so as to make the deformation less than the preset deformation threshold. For example, please refer to FIG. 3-1c, which is an effect diagram of adjusting the deformation of the end portion of the mask plate protruding from the base in the direction of gravity G according to an embodiment of the present disclosure. Before adjusting by the deformation adjusting assembly, the protruding end portion is at the position a1, and the protruding end portion is adjusted to the position b1 directly by an magnetic force of the deformation adjusting assembly 30, such that the deformation of the protruding end portion in the direction of gravity is smaller than the preset deformation threshold.

In embodiments of the present disclosure, FIG. 3-1, FIG. 3-1a, and FIG. 3-1b all illustrate a clamp 20, a supporting rod 11 and a deformation adjustment assembly 30 as an example. In actual applications, there are n2 clips, n2 supporting rods, n2 deformation adjusting assemblies in the tensioning device, wherein n2 is an integer greater than or equal to 4, and the n2 supporting rods are arranged in one-to-one correspondence with the n2 deformation adjusting assemblies.

Figures 1D, 3:
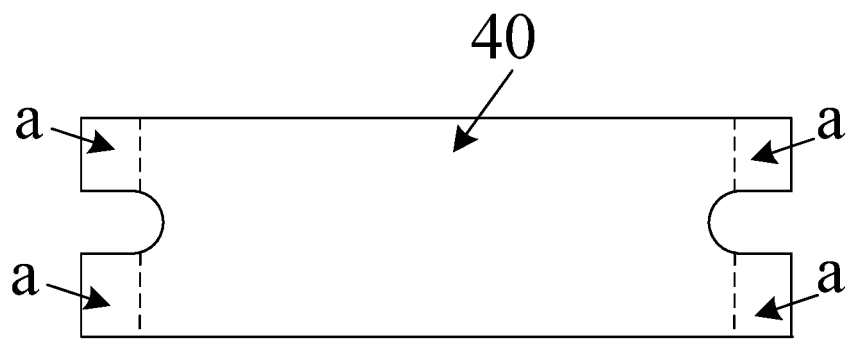
Figures 2, 3:
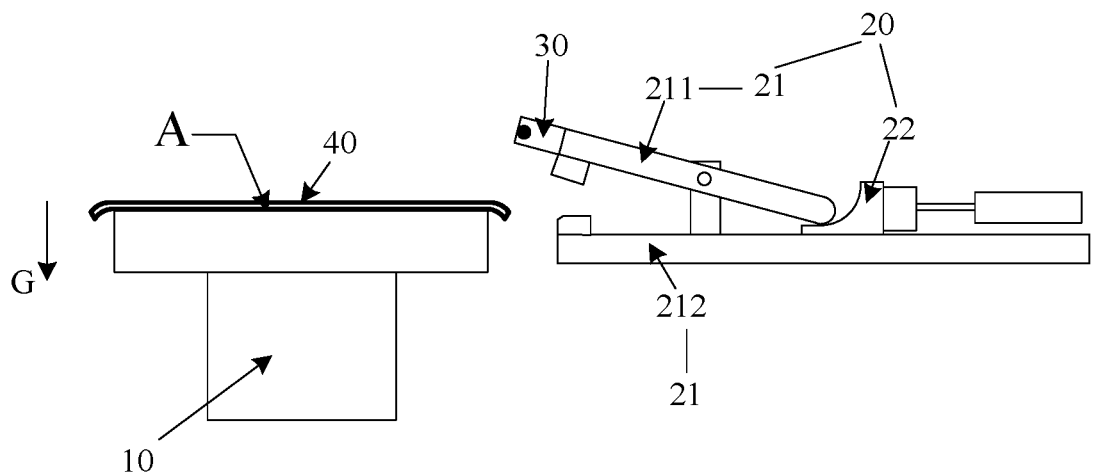

For example, please refer to FIG. 3-1d, which is a schematic plan view of a mask plate 40 according to an embodiment of the present disclosure. The mask plate 40 can comprise: 4 clamping regions a, the clamping regions a are the areas where the mask plate is clamped by the clamps. When the mask plate 40 is carried on the base, the four clamping regions a may be deformed in the direction of gravity. At this time, the tensioning device can comprise: 4 clamps, 4 supporting rods and four deformation adjusting assemblies, wherein the 4 supporting rods are arranged with the four deformation adjusting assemblies in one-to-one correspondence.

When the deformation adjusting assembly is disposed on the clamp in the tensioning device, please refer to FIG. 3-2, which is a schematic structural view of the tensioning device according to still another embodiment of the present disclosure, wherein the clamp 20 can comprise a clamping component 21 and a clamping force control assembly 22; the clamping assembly 21 can comprise a first sub-clamping member 211 and a second sub-clamping member 212, the first sub-clamping member 211 and the second sub-clamping member 212 being movably connected, one end of the first sub-clamping member 211 is located above the plane of the working surface A of the base 10, and one end of the second sub-clamping member 212 is located below the plane of the working surface A of the base 10; the clamping force control assembly 22 can control the clamping assembly 21 to clamp the mask plate. The deformation adjusting assembly 30 is disposed on the first end of the first sub-clamping member 211 and the second end of the first sub-clamping member 211 is movably connected to the clamping force control assembly 22.

It should be noted that when the deformation adjusting assembly is disposed on the clamp in the tensioning device, the deformation adjusting assembly can comprise an electromagnet and a current control unit, or the deformation adjusting assembly can comprise n1 detachable magnets. The operation principle of the deformation adjusting assembly adjusting the deformation of the end portion of the mask plate protruding from the base in the direction of gravity can be referred to the above embodiments, and will not be elaborated in the embodiment of the present disclosure. Only a manner in which the deformation adjusting assembly operates will be described hereinafter.

Referring to FIG. 3-2, when the base 10 carries the mask plate 40, since the deformation adjusting assembly 30 is provided at the first end of the first sub-clamping member 221, when the clamping assembly 21 holds the mask plate 40, the distance from the adjusting assembly 30 to the end portion of the mask plate 40 protruding from the base 10 is gradually changed, and the magnetic force applied on the end portion of the mask plate 40 by the deformation adjusting assembly 30 is gradually increased along with gradual reduction of the distance. At this time, if the clamp 20 is not working, the magnetic force applied by the deformation adjusting assembly 30 directly adjusts the deformation of the end portion of the mask plate 40 protruding from the base 10 in the gravity direction Q so as to make the deformation smaller than the preset deformation threshold. When the clamp 20 is in operation, the end portion of the mask plate 40 protruding from the base 10 will be bent upward due to gradual increase in the magnetic force applied by the deformation adjusting assembly 30.

Figures 2A, 3:
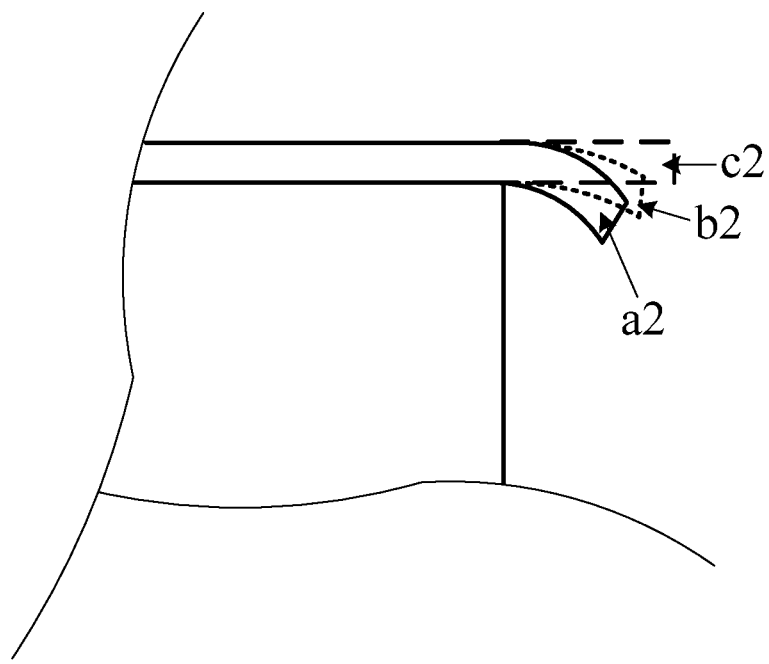

Therefore, as illustrated in FIG. 3-2a, which is an effect diagram of adjusting deformation of the end portion of the mask plate protruding from the base in the direction of gravity according to another embodiment of the present disclosure. Prior the adjusting by the adjustment assembly 30, the protruding end portion is at position a2; when the clamp 20 is not in operation, the magnetic force by the deformation adjusting assembly 30 acts on the protruding end portion and the protruding end portion is changed to position b2; when the clamp 20 is in operation, due to the distance between the deformation adjusting assembly 30 and the protruding end portion is continuously reduced, the magnetic force applied on the protruding end portion by the adjusting assembly 30 is continuously increased, and the protruding end portion can be adjusted to position c2, so that the deformation of the protruding end portion in the direction of gravity is less than the preset deformation threshold.

In the embodiment of the present disclosure, the preset deformation threshold can be 0.5 mm, and when the deformation of the end portion of the mask plate protruding from the base in the direction of gravity is less than 0.5 mm, the clamp can smoothly grip the mask plate.

In summary, in the tensioning device according to the embodiment of the present disclosure, a deformation adjusting assembly is provided on the base or at the clamp, and when the base carries the mask plate, the deformation adjusting assembly adjusts the deformation of the end portion of the mask plate protruding from the base so as to make the deformation less than the preset deformation threshold, such that the clamp can smoothly grip the mask.

Figure 4:
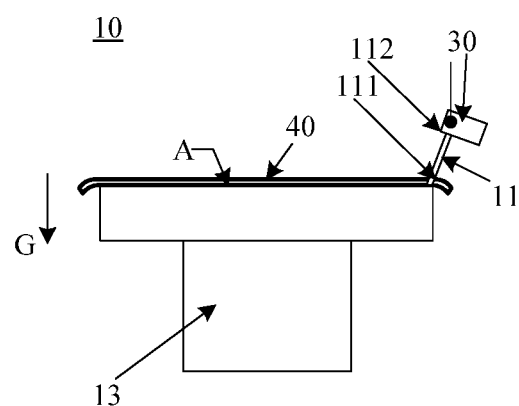
FIG. 4 is a schematic structural view of a base according to an embodiment of the present disclosure.

At least one embodiment of the present disclosure provides a base. As illustrated in FIG. 4, which is a schematic structural diagram of a base 10 according to an embodiment of the present disclosure, the base 10 can comprise:

a base body 13, a supporting rod 11 and a deformation adjusting assembly 30; a first end 111 of the supporting rod 11 is connected to the base body 13, and the deformation adjusting assembly 30 is provided at a second end 112 of the supporting rod 11, the deformation adjusting assembly 30 is located above the work surface A of the base body 13.

In an embodiment of the present disclosure, the deformation adjusting assembly can include an electromagnet and a current control unit; the electromagnet is connected to the current control unit, and the current control unit controls an electromagnetic force of the electromagnet by controlling magnitude of a current output to the electromagnet.

In an embodiment of the present disclosure, the deformation adjusting assembly can comprise n1 detachable magnets, wherein n1 is an integer greater than or equal to 2.

In one embodiment of the present disclosure, there are n2 supporting rods and n2 deformation adjusting assemblies in the base, n2 is an integer greater than or equal to 4, and the n2 supporting rods are arranged with the n2 deformation adjusting assemblies in one-to-one correspondence.

In an embodiment of the present disclosure, the base can further comprise: a measuring unit disposed on the base body and configured to measure an initial deformation of the end portion of the mask plate protruding from the base in the direction of gravity, the initial deformation being a deformation of the end portion of the mask plate protruding from the base in the direction of gravity before adjusting of the deformation adjusting assembly.

In an embodiment of the present disclosure, the current control unit is configured to acquire the initial deformation from the measurement unit, determine a current to be output according to the initial deformation, and output the current to the electromagnet.

In an embodiment of the present disclosure, magnitude of the current output by the current control unit is equal to the product of the initial deformation and a preset ratio, and an electromagnetic force applied by the electromagnet is less than or equal to the gravity that the end portion of the mask plate protruding from the base is subjected to.

In an embodiment of the present disclosure, the measuring unit can be a laser sensor.

In an embodiment of the present disclosure, the base can further comprise a display unit configured to acquire the initial deformation from the measurement unit and display the same.

One of ordinary skill in the art can clearly understand that for convenience and brevity of the description, the structure of the base described above can refer to the corresponding structure in the foregoing embodiment of the tensioning device, and details will not be described herein again.

In summary, in the base according to the embodiment of the present disclosure, the deformation adjusting assembly is disposed on the base, and when the base body carries the mask plate, the adjusting member adjusts the deformation of the end portion of the mask plate protruding from the base body in the direction of gravity so as to make the deformation less than the preset deformation threshold, such that the clamp can smoothly grip the mask plate.

Figures 5, 6:
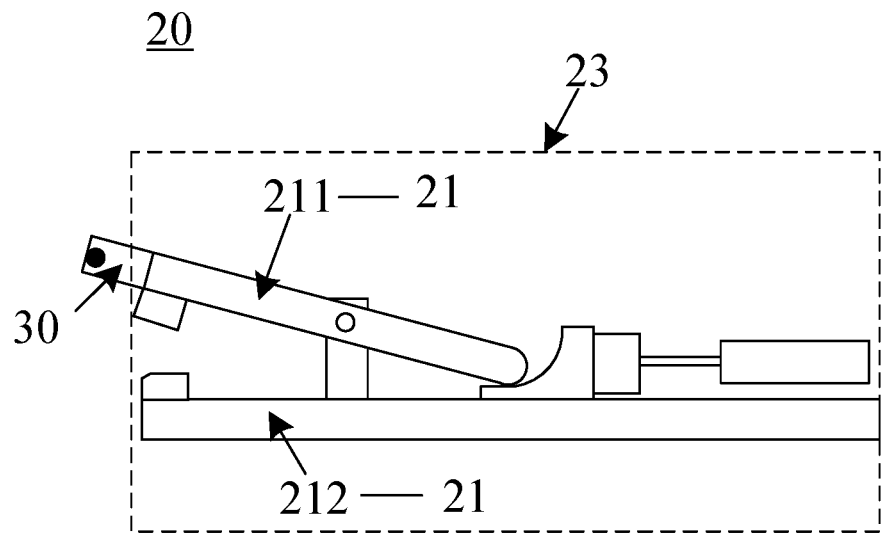
FIG. 5 is a schematic structural view of a clamp according to an embodiment of the present disclosure.
FIG. 6 is a flow chart of a method for clamping a mask plate according to an embodiment of the present disclosure.

At least one embodiment of the present disclosure provides a clamp. As illustrated in FIG. 5, which is a schematic structural view of the clamp 20 according to an embodiment of the present disclosure, which can comprise a clamp body 23 and a deformation adjusting assembly 30; the clamp body 23 can comprise a clamp assembly 21; the clamp assembly 21 can comprise a first sub-clamp 211 and a second sub-clamp 212, the deformation adjusting assembly 30 is provided at a first end of the first sub-clamp 211, and the first sub-clamp 211 is movably connected to the second sub-clamp 212.

In an embodiment of the present disclosure, the deformation adjusting assembly can comprise an electromagnet and a current control unit; the electromagnet is connected to the current control unit, and the current control unit controls magnitude of an output current so as to control the electromagnetic force applied by the electromagnet.

In an embodiment of the present disclosure, the deformation adjusting assembly can comprise n1 detachable magnets, wherein n1 is an integer greater than or equal to 2.

In an embodiment of the present disclosure, the clamp body can further comprise a clamping force control assembly, the clamping force control assembly can control the clamping assembly to clamp the mask plate, and another end of the first sub-clamp is movably connected to the clamping force control assembly.

One of ordinary skill in the art can clearly understand that for convenience and brevity of the description, the structure of the clamp as mentioned above can refer to the corresponding structure in the foregoing embodiment of the tensioning device, and details will not be described herein again. For processes of using the tensioning device, the base, and the clamp as described above, reference can be made to corresponding processes in the following method embodiments, and details will not be described herein again.

In summary, in the clamp according to the embodiment of the present disclosure, the deformation adjusting assembly is provided on the clamp, and when the base carries the mask plate, the adjusting member adjusts the deformation of the end portion of the mask plate protruding from the base in the direction of gravity so as to make the deformation less than the preset deformation threshold, such that the clamp can smoothly grasp the mask plate.

At least one embodiment of the present disclosure also provides a clamping method for the mask plate suitable for the tensioning device as described above. Please refer to FIG. 6, which is a flowchart of a clamping method for the mask plate according to an embodiment of the present disclosure. The method can comprise: adjusting a deformation of an end portion of a mask plate protruding from a base in a direction of gravity when the base carries the mask plate, so as to make the deformation less than a preset threshold; and grasping the mask plate through the clamp.

In summary, in the clamping method for the mask plate according to the embodiment of the present disclosure, the deformation adjusting assembly is disposed on the base or the clamp, and when the base carries the mask plate, the deformation adjusting assembly adjusts the deformation of the end portion of the mask plate protruding from the base so as to make the deformation less than the preset deformation threshold, such that the clamp can smoothly grasp the mask plate.

Figure 7:
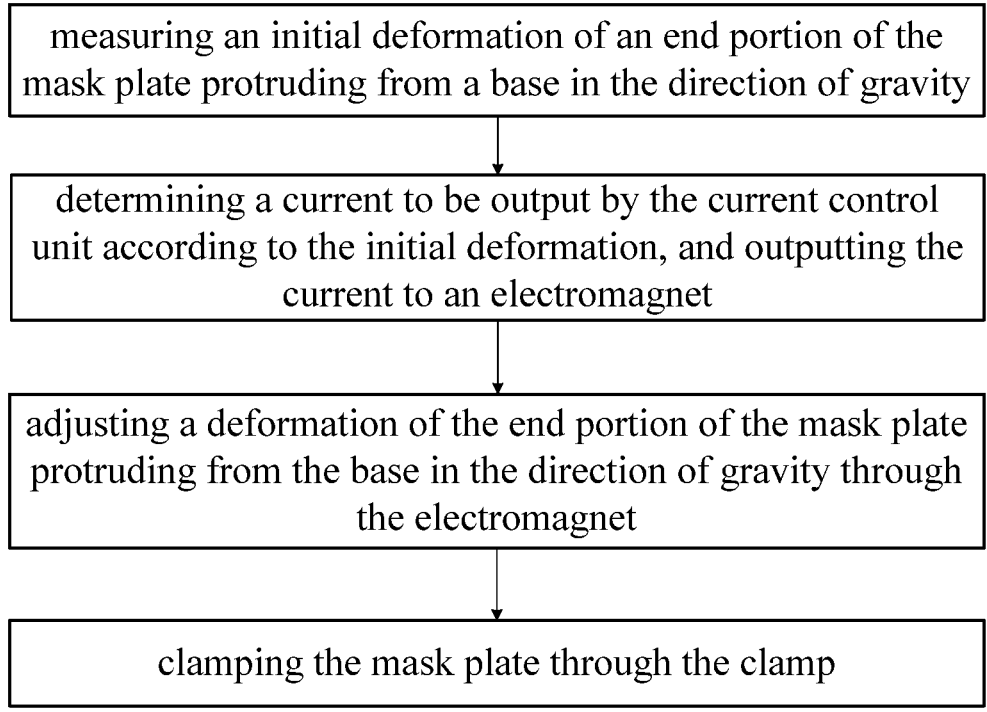
FIG. 7 is a flow chart of a method for clamping a mask plate according to another embodiment of the present disclosure.

Please refer to FIG. 7, which is a flowchart of a clamping method for a mask plate according to another embodiment of the present disclosure, the method can comprise:

measuring an initial deformation of an end portion of the mask plate protruding from a base in the direction of gravity;

determining a current to be output by the current control unit according to the initial deformation, and outputting the current to an electromagnet;

adjusting a deformation of the end portion of the mask plate protruding from the base in the direction of gravity through the electromagnet; and clamping the mask plate through the clamp.

The initial deformation is a deformation of the end portion of the mask plate protruding from the base in the direction of gravity before being adjusted by the deformation adjusting assembly. For example, when the mask plate is carried on the base, the initial deformation of the end portion of the mask plate protruding from the base in the direction of gravity can be measured by the measuring unit on the base.

When the current output by the current control unit is determined according to the initial deformation and the current is output to the electromagnet, since the output current of the current control unit is equal to the product of the initial deformation and a preset ratio, magnitude of the current to be output by the current control unit can be calculated according to the initial deformation, and the current is output to the electromagnet.

When the electromagnet adjusts the deformation of the end portion of the mask plate protruding from the base in the direction of gravity, for example, when the electromagnet is disposed on the base, the electromagnet generates an electromagnetic force corresponding to the current output by the current control unit, upon receiving the current output by the current control unit. The electromagnetic force acts on the end portion of the mask plate protruding from the base, and adjusts the deformation of the end portion of the mask plate protruding from the base in the direction of gravity, so as to make the deformation is less than a preset deformation threshold. Or, for example, when the electromagnet is disposed on the clamp, the electromagnet generates an electromagnetic force corresponding to the current output by the current control unit, upon receiving the current output by the current control unit. The electromagnetic force can adjust the deformation of the end portion of the mask plate protruding from the base in the direction of gravity, so as to make the deformation less than the initial deformation and greater than the preset deformation threshold.

When the deformation of the end portion of the mask plate protruding from the base in the direction of gravity is less than the preset deformation threshold, the mask plate can be smoothly clamped by the clamp.

It should be noted that the clamping method for the mask plate is schematically illustrated by taking the deformation adjusting assembly comprising a current control unit and an electromagnet as an example. In the embodiment of the present disclosure, the clamping method for the mask plate in which the deformation adjusting assembly comprises n1 detachable magnets is similar to the clamping method for the mask plate in which the deformation adjusting assembly comprises the current control unit and the electromagnet, and details will not be described herein.

It can be clearly understood by one of ordinary skill in the art that, for the convenience and brevity of the description, a control principle in the clamping method for the mask plate described above can be referred to the embodiment of the tensioning device as described above, and details will not elaborated herein again.

In summary, in the clamping method for the mask plate according to the embodiments of the present disclosure, the deformation adjusting assembly is provided on the base or on the clamp, and when the base carries the mask plate, the deformation adjusting assembly adjusts the deformation of the end portion the mask plate protruding from the base in the direction of gravity, so as to make the deformation less than the preset deformation threshold, such that the clamp can smoothly grip the mask.

The foregoing are merely exemplary embodiments of the disclosure, but are not used to limit the protection scope of the disclosure. The protection scope of the disclosure shall be defined by the attached claims.

The invention claimed is:

1. A tensioning device, comprising: a base configured to carry a mask plate; a clamp configured to clamp the mask plate; a deformation adjusting assembly provided on the base or on the clamp; wherein the deformation adjusting assembly comprises an electromagnet and a current control unit, and is configured to adjust a deformation of an end portion of the mask plate protruding from the base in a direction of gravity when the base carries the mask plate, so as to make the deformation less than a preset deformation threshold; and a measuring unit configured to measure an initial deformation of the end portion of the mask plate protruding from the base in the direction of gravity, the initial deformation is a deformation of the end portion of the mask plate protruding from the base in the direction of gravity before being adjusted by the deformation adjusting assembly; wherein the current control unit is configured to acquire the initial deformation from the measuring unit and determine an output current according to the initial deformation, and output the output current to the electromagnet, such that a magnitude of the output current output by the current control unit is equal to a product of the initial deformation and a preset ratio; and a resulting electromagnetic force of the electromagnet being powered by the output current is less than or equal to a gravity applied to the end portion of the mask plate protruding from the base to prevent the protruding end portion from being bent upward due to excessive electromagnetic force.

2. The tensioning device according to claim 1, wherein the electromagnet is connected to the current control unit and the current control unit is configured control a magnitude of an output current so as to control an electromagnetic force of the electromagnet.

3. The tensioning device according to claim 1, wherein the deformation adjusting assembly comprises n1 detachable magnets, n1 being an integer greater than or equal to 2.

4. The tensioning device according to claim 1, further comprising a supporting rod, wherein the supporting rod has a first end disposed on the base and the deformation adjusting assembly is provided at a second end of the supporting rod and is located above a working surface of the base.

5. The tensioning device according to claim 1, wherein
the clamp comprises a clamping assembly, and the clamping assembly comprises a first sub-clamping member and a second sub-clamping member;
wherein the first sub-clamping member and the second sub-clamping member being movably connected, one end of the first sub-clamping member is located above the plane of the working surface of the base, and one end of the second sub-clamping member is located below the plane of the working surface of the base; and
the deformation adjusting assembly is provided on the first end of the one end of the first sub-clamping member.

6. The tensioning device according to claim 4, wherein the tensioning device comprises n2 clips, n2 supporting rods, and n2 deformation adjusting assemblies, wherein n2 is an integer greater than or equal to 4, and the n2 supporting rods are arranged in one-to-one correspondence with the n2 deformation adjusting assemblies.

7. The tensioning device according to claim 1, wherein the magnitude of the output current of the current control unit is equal to a product of the initial deformation and a preset ratio, and
the electromagnetic force of the electromagnet is required to be less than or equal to a gravity applied to the end portion of the mask plate protruding from the base.

8. The tensioning device according to claim 2, wherein the deformation adjusting assembly comprises n1 detachable magnets, n1 being an integer greater than or equal to 2.

9. The tensioning device according to claim 2, further comprising a supporting rod, wherein the supporting rod has a first end disposed on the base and the deformation adjusting assembly is provided at a second end of the supporting rod and is located above a working surface of the base.

10. The tensioning device according to claim 2, wherein
the clamp comprises a clamping assembly, and the clamping assembly comprises a first sub-clamping member and a second sub-clamping member;
wherein the first sub-clamping member and the second sub-clamping member being movably connected, one end of the first sub-clamping member is located above the plane of the working surface of the base, and one end of the second sub-clamping member is located below the plane of the working surface of the base; and
the deformation adjusting assembly is provided on the first end of the one end of the first sub-clamping member.

11. The tensioning device according to claim 1, further comprising a supporting rod, wherein the supporting rod has a first end disposed on the base and the deformation adjusting assembly is provided at a second end of the supporting rod and is located above a working surface of the base.

12. A clamping method for a mask plate, applicable to the tensioning device according to claim 1, the method comprising:
adjusting the deformation of the end portion of the mask plate protruding from the base in the direction of gravity when the base carries the mask plate, through the deformation adjusting assembly, so as to make the deformation less than a preset threshold; and grasping the mask plate through the clamp.

13. The method according to claim 12, wherein adjusting the deformation of the end portion of the mask plate protruding from the base in the direction of gravity through the deformation adjusting assembly comprising:

adjusting the deformation of the end portion of the mask plate protruding from the base in the direction of the gravity through the electromagnet.

14. The method according to claim 13, wherein before adjusting the deformation of the end portion of the mask plate protruding from the base in the direction of the gravity through the electromagnet, the method further comprises:

measuring an initial deformation of the end portion of the mask plate protruding from the base in the direction of gravity, the initial deformation being a deformation of the end portion of the mask plate protruding from the base without being adjusted by the deformation adjusting assembly; and determining a current to be output by the current control unit according to the initial deformation, and outputting the current to the electromagnet.

\* \* \* \* \*